United States Patent
Endo et al.

[11] Patent Number: 5,935,344
[45] Date of Patent: Aug. 10, 1999

[54] PHOTOVOLTAIC ELEMENT AND MANUFACTURING METHOD THEREOF

[75] Inventors: Koji Endo, Osaka; Masaki Shima, Kyoto, both of Japan

[73] Assignee: Sanyo Electric Co., Ltd., Moriguchi, Japan

[21] Appl. No.: 08/736,418

[22] Filed: Oct. 24, 1996

[30] Foreign Application Priority Data

Oct. 26, 1995 [JP] Japan ................................. 7-278991

[51] Int. Cl.⁶ ..................................................... H01L 31/00
[52] U.S. Cl. .......................................... 136/255; 136/256
[58] Field of Search ..................................... 136/255, 256

[56] References Cited

U.S. PATENT DOCUMENTS

| | | | |
|---|---|---|---|
| 4,824,488 | 4/1989 | Sakai et al. | 135/244 |
| 4,989,059 | 1/1991 | Micheels et al. | 136/255 |
| 5,053,083 | 10/1991 | Sinton | 136/255 |
| 5,082,791 | 1/1992 | Micheels et al. | 136/255 |
| 5,342,451 | 8/1994 | Virshup | 136/255 |

FOREIGN PATENT DOCUMENTS

| | | |
|---|---|---|
| 60-3164 | 1/1985 | Japan . |
| 60-260392 | 12/1985 | Japan . |
| 63-261883 | 10/1988 | Japan . |

OTHER PUBLICATIONS

Taiyo Energy Kogaku, Solar Energy Engineering, by Baifukan 1994.
Taiyo Energy Heno Chosen, "Challenge to Solar Energy" by Seibunsha 1994.

*Primary Examiner*—Mark Chapman
*Attorney, Agent, or Firm*—Armstrong, Westerman, Hattori, McLeland & Naughton

[57] ABSTRACT

A photovoltaic element having improved conversion efficiency and improved light confining property as well as a method of manufacturing the photovoltaic element with superior productivity are provided. The photovoltaic element includes an n type single crystal silicon substrate having first and second main surfaces, an intrinsic amorphous silicon layer formed on the first main surface, a p type amorphous silicon layer formed thereon, a conductive thin film formed thereon, a collecting electrode formed thereon, an intrinsic amorphous silicon layer formed on the second main surface of n type single crystal silicon substrate, an n type amorphous silicon layer formed thereon, a conductive thin film formed thereon and a back electrode formed thereon. At a peripheral portion of a laminated portion including the intrinsic amorphous silicon layer formed on the first main surface of the n type single crystal silicon substrate, the p type amorphous silicon layer and the conductive thin film, a trench deep enough to reach at least the intrinsic amorphous semiconductor layer is formed.

8 Claims, 5 Drawing Sheets

PHOTOVOLTAIC ELEMENT AND MANUFACTURING METHOD THEREOF

BACKGROUND OF THE INVENTION

1. Field of the Invention

The present invention relates to a photovoltaic element such as a solar cell and to a method of manufacturing the same. More specifically, the present invention relates to a photovoltaic element having a heterojunction constituted by combining a crystal semiconductor and an amorphous semiconductor, and to a manufacturing method thereof.

2. Description of the Background Art

Recently, solar cells employing crystal silicon such as single crystal silicon and polycrystalline silicon have been much studied and practically implemented as photovoltaic elements. Among these, a solar cell having a heterojunction constituted by combining amorphous silicon and crystal silicon has been attracting attention, as the junction can be formed through a low temperature process of at most 200° C. and it provides high conversion efficiency.

Further, it has been known that by inserting a thin intrinsic amorphous silicon at the heterojunction interface between the crystal silicon and the amorphous silicon, properties of the solar cell can be significantly improved.

Meanwhile, in manufacturing a conventional photovoltaic element in which amorphous semiconductor and crystal silicon are combined, different from a photovoltaic element consisting only of crystal silicon, it is necessary to form an amorphous silicon layer or a conductive thin film for forming a junction on the crystal silicon substrate.

Conventionally, when such a film is formed on the substrate, manufacturing method such as plasma CVD, sputtering or vapor deposition has been utilized. Accordingly, the amorphous silicon layer or a conductive thin film extends not only over the surface of the substrate but also to the side surface or further to the rear surface, possibly causing short-circuit of the element.

Accordingly, as disclosed, for example, in *TAIYO ENERGY KOGAKU* (Solar Energy Engineering), issued by BAIFUKAN, pp. 221 or in *TAIYO ENERGY HENO CHOSEN* (Challenge to Solar Energy), issued by SEIBUNSHA, p. 50, film formation has been performed while covering peripheral portions of the substrate by means of a mask formed of metal, for example, in order to prevent the above described extension of the film to the side surface or to the rear surface.

Figure 8:
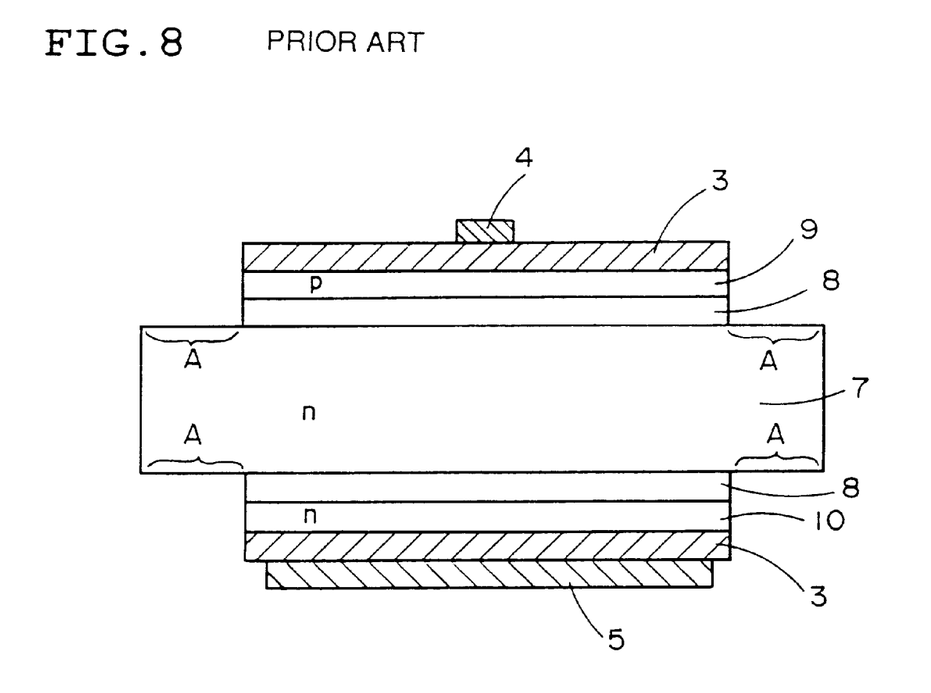
FIG. 8 is a cross section showing a structure of an example of a conventional photovoltaic element.

FIG. 8 is a cross section showing a structure of an example of a photovoltaic element manufactured through the conventional method using such as a mask.

Referring to FIG. 8, the photovoltaic element includes, on a surface of an n type crystal silicon substrate 7, an intrinsic amorphous silicon layer 8, a p type amorphous silicon layer 9, a conductive thin film 3 and a collecting electrode 4 formed in this order, and on a rear surface of crystal silicon substrate 7, an intrinsic amorphous silicon layer 8, an n type amorphous silicon layer 10, a conductive thin film 3 and a back electrode 5 formed in this order.

However, in the conventional photovoltaic element shown in FIG. 8, amorphous silicon layers 9 and 10, conductive thin film 3 and the like are not formed at the peripheral portion A of substrate 7. Therefore, this portion A is a non-generating portion or a high resistance portion, which means that it is a loss portion. As a result, effective area is reduced and conversion efficiency is low.

Further, as conductive thin film 3 also serves as an anti reflection film, when there is a portion on which conductive thin film 3 is not formed, there is a reflection loss, and light confining property is decreased.

Generally, for mass production, the number of steps employing mask should be as small as possible. In other words, the conventional manufacturing method using a mask leads to poor productivity.

SUMMARY OF THE INVENTION

An object of the present invention is to solve the above described problems and to provide a photovoltaic element having improved conversion efficiency and improved light confining property and to provide a method of manufacturing the photovoltaic element with high productivity.

According to one aspect of the present invention, a photovoltaic element is provided which includes, on one main surface of a crystal semiconductor substrate of one conductivity type, a laminated body of an amorphous semiconductor layer of the other conductivity type and a conductive thin film, wherein a trench is formed at a peripheral portion of the laminated body on the main surface of the substrate by removing at least the laminated body.

Preferably, in the present invention, an intrinsic amorphous semiconductor layer is provided between the substrate and the amorphous semiconductor layer.

According to another aspect of the present invention, a photovoltaic element is provided which includes, on one main surface of a crystal semiconductor substrate of one conductivity type, an amorphous semiconductor layer of another conductivity type and a conductive thin film, and on the other main surface of the substrate, a back electrode, wherein a trench is formed at a peripheral portion of the back electrode on the other main surface, by removing the back electrode.

According to a still further aspect of the present invention, a photovoltaic element is provided which includes, on one main surface of a crystal semiconductor substrate of one conductivity type, a laminated body of an amorphous semiconductor layer of the same conductivity type and a back electrode, wherein a trench is formed at the peripheral portion of the laminated body on the main surface by removing at least the laminated body.

Preferably, an intrinsic amorphous semiconductor layer is provided between the substrate and the amorphous semiconductor layer.

More preferably, in the present invention, a conductive thin film is provided between the amorphous semiconductor layer and the back electrode.

According to a still further aspect of the present invention, a photovoltaic element is provided which includes, entirely on one main surface of a crystal semiconductor substrate of one conductivity type, a conductive thin film and an amorphous semiconductor layer forming a heterojunction with said substrate, wherein side surfaces of the crystal semiconductor substrate are at least partially exposed in thickness direction, and the exposed portion is continuous and surrounding outer peripheral side surfaces of the substrate.

According to a still further aspect of the present invention, a method of manufacturing a photovoltaic element is provided, in which the photovoltaic element is obtained by forming at least an amorphous semiconductor layer to form a heterojunction entirely on one main surface of a crystal semiconductor substrate of one conductivity type, wherein a side surface of the photovoltaic element is irradiated with laser so that amorphous semiconductor layer formed on the side surfaces is removed, and at least a portion of the side surfaces of the photovoltaic element in the thickness direction is exposed continuously to surround the side surfaces.

Preferably, in the present invention, side surfaces of a plurality of laminated photovoltaic elements may be irradiated with laser.

In the photovoltaic element in accordance with the present invention, a trench is formed at a peripheral portion of a laminated body including an amorphous semiconductor layer and a conductive thin film formed on a crystal semiconductor substrate, by removing the laminated body.

Therefore, leak current caused by excessively extended conductive thin film or amorphous semiconductor layer can be prevented, and hence junction short-circuit can be prevented.

Here, the depth of the trench may be deep enough to remove the intrinsic amorphous semiconductor layer to expose the crystal semiconductor substrate surface, or it may at least be enough to reach the intrinsic amorphous semiconductor layer. Since the intrinsic amorphous semiconductor layer has high resistance, short-circuit is not likely even when the excessively extended portion is not always removed.

In the present invention, the trench is formed by laser irradiation, for example. When cutting and removal are performed by laser irradiation, the cutting width of 100 to 200 $\mu$m is possible. As a result, effective area can be enlarged, conversion efficiency can be improved and light confining property can also be improved.

As for the method of removing a film by using laser, Japanese Patent Laying-Open No. 60-260392 discloses a method of removing a conductive film, and U.S. Pat. No. 4,824,488 discloses a method of removing an amorphous semiconductor layer. However, these employ laser for forming connecting region in an integrated type solar cell.

By contrast, in the present invention, laser is used for separating junction between front and rear sides of the solar cell, and provides remarkable effect in improving properties of the solar cell.

Further, according to the present invention, mask becomes unnecessary during the steps of manufacturing, and hence productivity can be improved.

Further, in the present invention, the conductive thin film and the amorphous semiconductor layer formed on the side surfaces of the crystal semiconductor substrate may be removed by laser irradiation. Similarly, since leak current caused by excessively extended conductive thin film or the amorphous semiconductor layer is eliminated, junction short-circuit can be prevented.

At this time, since the crystal semiconductor substrate is very thin, a plurality of crystal semiconductor substrates may be stacked and irradiated with laser, so as to remove the conductive thin film, the amorphous semiconductor layer and the like formed on the side surfaces of the substrates.

According to the present invention, since use of a mask becomes unnecessary during the steps of manufacturing and it is possible to irradiate a plurality of crystal semiconductor substrates with laser at one time, the invention is particularly effective in improving productivity.

As described above, according to the present invention, a photovoltaic element is obtained in which light confining property is improved because of the entire anti reflection coating of the conductive thin film and of which conversion efficiency is improved as the effective area is increased.

Further, according to the method of manufacturing a photovoltaic element of the present invention, manufacturing without mask becomes possible, and hence productivity can be significantly improved.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS (First Embodiment)

Figure 1A:
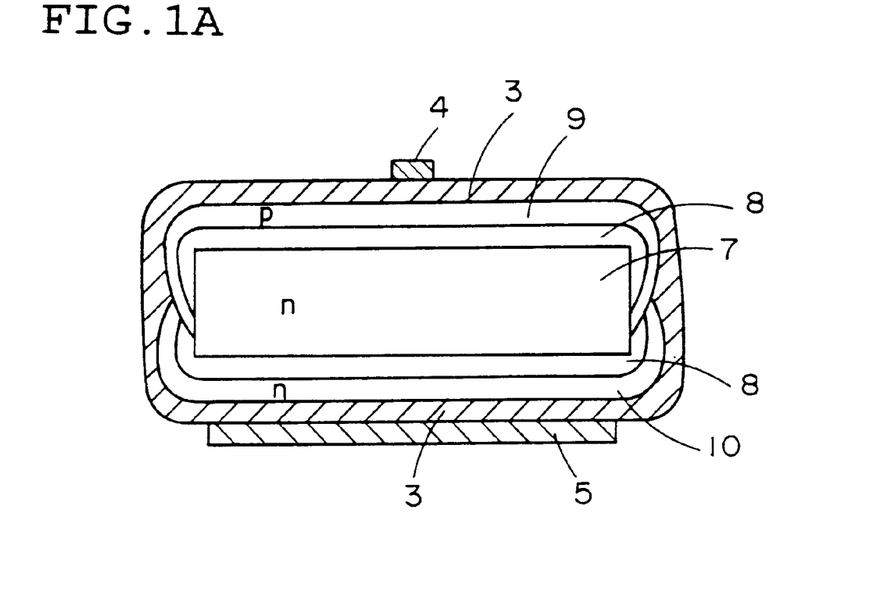
FIGS. 1A and 1B are cross sections showing an example of the photovoltaic element in accordance with the present invention.
Figure 1B:
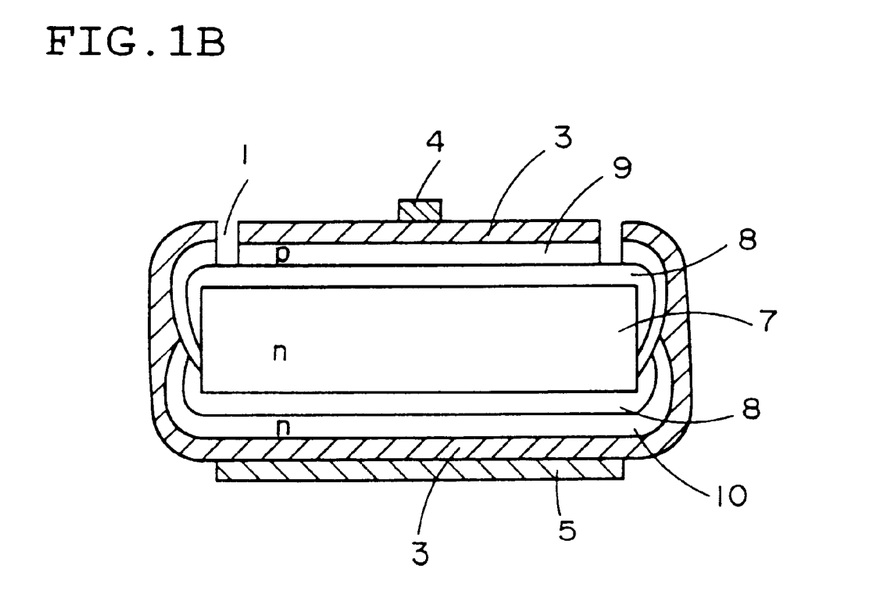

FIGS. 1A and 1B are cross sections showing an example of the photovoltaic element in accordance with the present invention.

Referring to FIGS. 1A and 1B, a method of manufacturing an example of the photovoltaic element in accordance with the present invention will be described.

First, as a crystal semiconductor substrate, an n type single crystal silicon substrate 7 having the specific resistance of 0.1 to 10 $\Omega$cm, the size of 10 cm square and the thickness of 200 to 400 $\mu$m was used, which was placed in a plasma CVD apparatus without any mask, the apparatus was evacuated and then heated to about 120 to 270° C. Thereafter, in the aforementioned plasma CVD apparatus, glow discharge was generated, a silicon compound gas such as silane was dissolved by the plasma energy, and an intrinsic amorphous silicon layer 8 having the thickness of at most 250 Å was formed on a first main surface of the n type single crystal silicon substrate 7. Thereafter, on the intrinsic amorphous silicon layer 8 thus formed, a p type amorphous silicon layer 9 which had different conductivity type from single crystal silicon substrate 7 was formed by the plasma CVD, similar to intrinsic amorphous silicon layer 8. The aforementioned silicon compound gas with diborane gas added was used as the reaction gas.

Thereafter, on a second main surface opposing to the first main surface of the n type single crystal silicon substrate 7, an intrinsic amorphous silicon layer 8 was formed, and an n type amorphous silicon layer 10 excessively doped with n type impurity was formed. The aforementioned silicon compound gas with phosphine gas added was used as n type reaction gas.

The conditions for forming the amorphous silicon layer are as shown in Table 1. In Table 1, "p type" represents p type amorphous semiconductor layer 9, "n type" represents n type amorphous semiconductor layer 10 and "i type" represents intrinsic amorphous semiconductor layer 8. $B_2H_6$ and $PH_3$ are diluted to 1% by $H_2$ gas.

TABLE 1

Conditions for Forming Amorphous Silicon Layer

| Amorphous Silicon | Gas Flow Rate (sccm) | | | | Substrate Temperature (° C.) | Discharge Gas Pressure (Pa) | Discharge Power (mW/cm²) |
| --- | --- | --- | --- | --- | --- | --- | --- |
| | $SiH_4$ | $B_2H_6$ (1%) | $PH_3$ (1%) | $H_2$ | | | |
| p type | 5 | 3~30 | — | 0~70 | 120~180 | 15~27 | 25~75 |
| n type | 10 | — | 20 | — | 120~180 | 8~27 | 55 |
| i type | 5 | — | — | 0~100 | 120~270 | 5~27 | 25~75 |

Thereafter, in order to reduce surface resistance of the photovoltaic element, to prevent reflection, to provide light confining effect and to prevent alloying of the amorphous silicon, on p type amorphous silicon layer 9 and n type amorphous silicon layer 10 formed on both main surfaces of n type single crystal silicon substrate 7, a transparent conductive thin film 3 such as ITO (Indium Tin Oxide) film was formed by sputtering.

Finally, on conductive thin film 3 formed on the first main surface of n type single crystal silicon substrate 7, a metal electrode 4 was formed as a collecting electrode, while a metal electrode 5 was formed on the conductive thin film 3 formed on the second main surface as a back electrode, and thus the process for forming the films for the photovoltaic element was completed.

FIG. 1A is a cross section showing the state of the photovoltaic element after the completion of the film forming process.

Referring to FIG. 1A, in the overall process of film forming described above, a mask is not used, unlike the prior art. Further, the films are formed by plasma CVD and sputtering. Therefore, in this stage, the intrinsic amorphous silicon layer 8, the p type amorphous silicon layer 9 and the conductive thin film 3 formed on the first main surface of n type single crystal silicon substrate 7 are formed extending to the side surfaces or even to the second main surface of substrate 7. Meanwhile, the intrinsic amorphous silicon layer 8, the n type amorphous silicon layer 10 and the conductive thin film 3 formed on the second main surface of n type single crystal silicon substrate 7 also extend over the side surface or even to the first main surface of substrate 7.

Therefore, in this state, the photovoltaic element may suffer from short-circuit and degradation in properties, because of the excessive extension of the amorphous silicon layer or the conductive thin film.

Therefore, in the first embodiment, in order to prevent short-circuit and degradation of properties, a trench 1 was formed at the periphery of a laminated body including p type amorphous silicon layer 9 and conductive thin film 3, on the first main surface of the n type single crystal silicon substrate 7.

FIG. 1B is a cross section showing a structure of an example of the photovoltaic element with the trench 1 formed in this manner.

Referring to FIG. 1B, the depth of trench 1 may be deep enough to remove intrinsic amorphous semiconductor layer 8 to expose the first main surface of n type single crystal silicon substrate 7, or it may be sufficient to reach the intrinsic amorphous silicon layer 8, removing at least the laminated body including p type amorphous silicon layer 9 and conductive thin film 3. More specifically, as the conductivity of intrinsic amorphous silicon is smaller in at least three orders of magnitude than p type amorphous silicon, that is, it has high resistance, the intrinsic amorphous silicon layer 8 need not be removed by laser irradiation.

Figure 2:
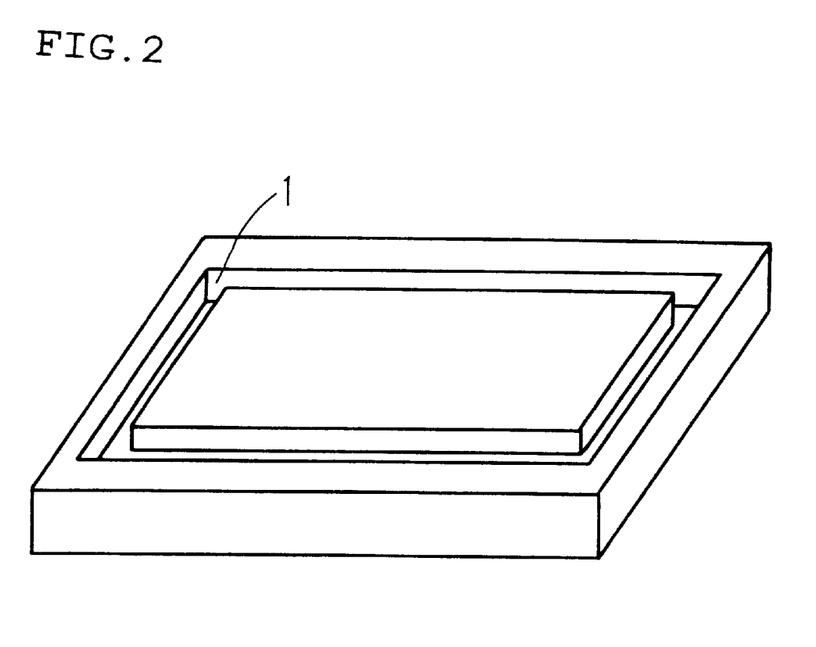
FIG. 2 is a perspective view showing how the trench is formed in the photovoltaic element of FIG. 1B.

FIG. 2 is a perspective view showing how the trench is formed in the photovoltaic element of FIG. 1B.

Referring to FIG. 2, in the photovoltaic element, a continuous trench 1 is formed at a peripheral portion of the laminated body formed on the substrate.

As for the conditions of laser irradiation to form such a trench, the laser beam passes through conductive thin film 3 and p type amorphous silicon layer 9 and reaches the intrinsic amorphous silicon layer 8 when a laser exceeding the wavelength of 400 nm such as Ar laser, second harmonics wave of YAG laser or the like is used and appropriate power of 0.1 to 10 Joule/cm² is used. As a result, it becomes possible to remove conductive thin film 3 and p type amorphous silicon layer 9. The width of p type amorphous silicon layer 9 and conductive thin film 3 removed by laser irradiation under such conditions was about 100 μm to about 1 mm.

Conversion efficiency of the photovoltaic element in accordance with the first embodiment manufactured in this manner (represented as "present invention" in Table 2) was measured.

For comparison, the conversion efficiency of a photovoltaic element manufactured by using the conventional mask shown in FIG. 8 (represented as "prior art" in Table 2) was also measured.

Table 2 shows the result of measurement.

TABLE 2

| | Conversion Efficiency |
| --- | --- |
| Prior Art | 18.50% |
| Present Invention | 18.70% |

As is apparent from Table 2, according to the present invention, it becomes possible to form a film entirely over the main surface of the single crystal silicon substrate 7. Therefore, effective area is increased, and in addition, since the entire surface has anti reflection coating of the conductive thin film, the conversion efficiency is improved by about 1%.

(Second Embodiment)

Figure 3:
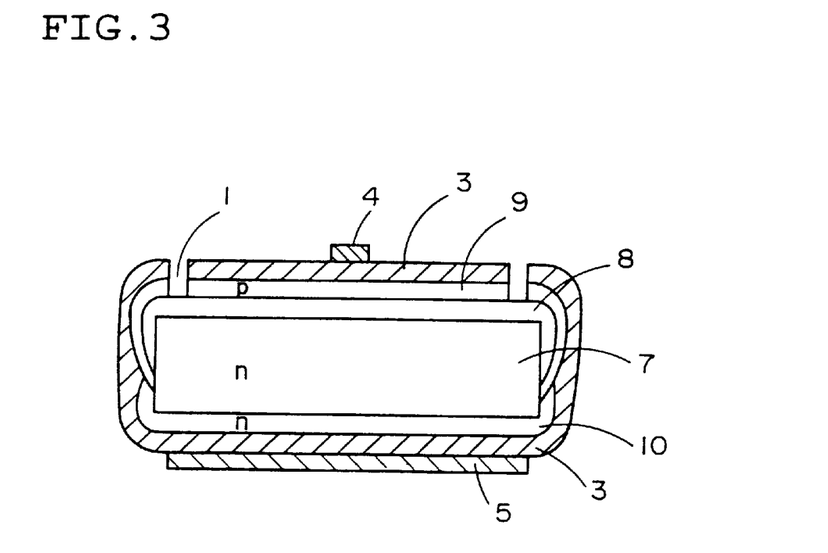
FIG. 3 is a cross section showing another example of the photovoltaic element in accordance with the present invention.

FIG. 3 is a cross section showing a structure of another example of the photovoltaic element in accordance with the present invention.

Referring to FIG. 3, in the photovoltaic element, an n type amorphous silicon layer 10 is formed directly on the second main surface of n type single crystal silicon substrate 7, without providing an intrinsic amorphous silicon layer interposed. Except this point, the structure is the same as the first embodiment shown in FIG. 1B, and therefore description thereof is not repeated.

The present invention is also applicable to such a photovoltaic element in which intrinsic amorphous silicon layer 8 is formed only on the first main surface of n type single crystal silicon substrate 7.

Further, the present invention provides similar effects in an element in which back electrode 5 only is formed on the second main surface of single crystal silicon substrate 7.

Further, the intrinsic amorphous silicon layer 8 interposed between n type single crystal silicon substrate and p type amorphous silicon layer 9 may be eliminated. In such a case also, similar effects can be provided by removing the laminated body including p type amorphous silicon layer 9 and conductive thin film 3 to form a trench 1 exposing n type single crystal silicon substrate 7.

(Third Embodiment)

Figure 4:
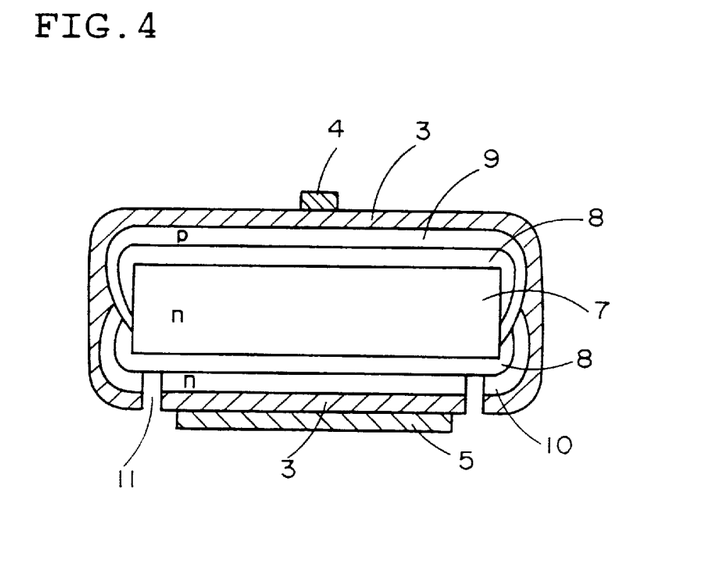
FIG. 4 is a cross section showing a structure of a still further example of the photovoltaic element in accordance with the present invention.

FIG. 4 is a cross section showing a structure of a still further example of the photovoltaic element in accordance with the present invention.

Referring to FIG. 4, in the photovoltaic element, a trench 11 is formed not on the first main surface of the n type single crystal silicon substrate 7 but on the second main surface. More specifically, in the third embodiment, trench 11 is formed at a peripheral portion of a laminated body including n type amorphous silicon layer 10 and conductive thin film 3 formed on the second main surface of n type single crystal silicon substrate 7, by laser irradiation. As for the depth of trench 11, the trench may be deep enough to remove intrinsic amorphous semiconductor layer 8 to expose the second main surface of n type single crystal silicon substrate 7, or to reach intrinsic amorphous silicon layer 8, removing at least a laminated body of n type amorphous silicon layer 10 and conductive thin film 3, as in the first embodiment.

Except this point, the structure is the same as the first embodiment, and hence description thereof is not repeated.

In the present invention, the trench for preventing short-circuit may be provided on the side where the back electrode is formed of n type single crystal silicon substrate as described above.

(Fourth Embodiment)

Figure 5:
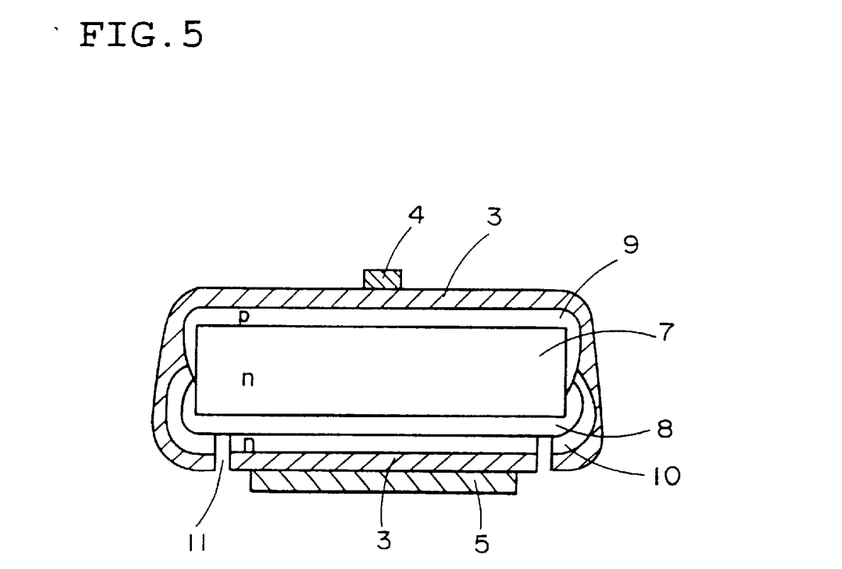
FIG. 5 is a cross section showing a structure of a still further example of the photovoltaic element in accordance with the present invention.

FIG. 5 is a cross section showing a structure of a still further example of the photovoltaic element in accordance with the present invention.

Referring to FIG. 5, in the photovoltaic element, p type amorphous silicon layer 9 is formed directly on the first main surface of n type single crystal silicon substrate 7 without providing an intrinsic amorphous silicon layer interposed. Except this point, the structure is the same as the third embodiment shown in FIG. 4, and therefore description thereof is not repeated.

The present invention is also applicable to such a photovoltaic element in which intrinsic amorphous silicon layer 8 is formed only on the second main surface of n type single crystal silicon substrate 7.

Further, when metal electrode 5 only is provided on the second main surface of substrate 7, a trench exposing the main surface of the substrate 7 may be provided by removing the metal electrode 5.

Further, the intrinsic amorphous silicon layer 8 interposed between n type single crystal silicon substrate 7 and n type amorphous silicon layer 10 may be eliminated. In this case also, by providing a trench to expose n type single crystal silicon substrate 7 removing the laminated body of n type amorphous silicon layer 10 and conductive thin film 3, similar effects can be obtained.

(Fifth Embodiment)

Figure 6:
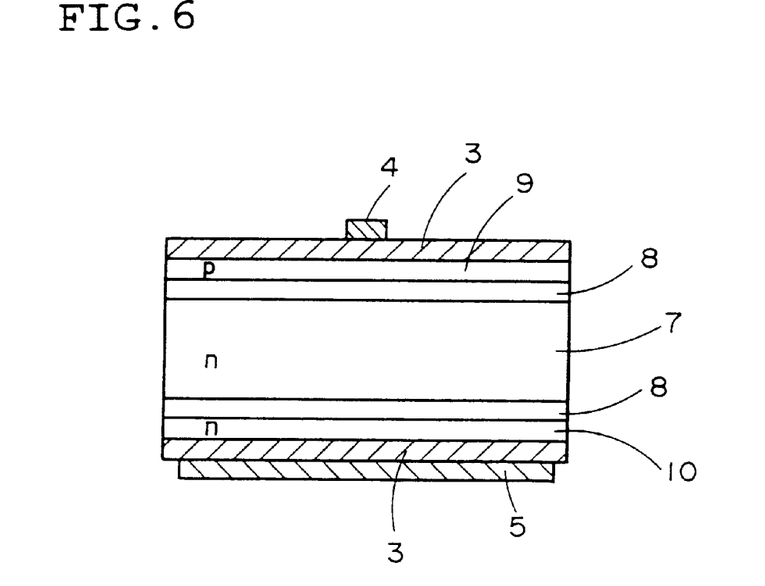
FIG. 6 is a cross section showing a structure of a still further example of the photovoltaic element manufactured by the present invention.

FIG. 6 is a cross section showing a structure of a still further example of the photovoltaic element manufactured by the present invention.

Referring to FIG. 1A, a plurality of photovoltaic elements which have gone through the process of film formation was stacked. Thereafter, from a direction orthogonal to the stacked substrate surfaces, portions outer than the side surfaces of the substrate were irradiated with laser.

As a result, as shown in FIG. 6, intrinsic amorphous silicon layer 8, p type amorphous silicon layer 9, n type amorphous silicon layer 10 and conductive thin film 3 formed on the side surface of n type single crystal silicon substrate 7 were removed, and photovoltaic elements with the side surfaces of single crystal substrates 7 exposed were obtained. In this manner, by removing intrinsic amorphous silicon layer 8, p type amorphous silicon layer 9, n type amorphous silicon layer 10 and conductive thin film 3 formed on the side surface of n type single crystal silicon substrate 7 entirely, the short-circuit of the photovoltaic element caused by excessive extension of these films and degradation of properties can be effectively prevented.

The above described process may be performed on the photovoltaic elements one by one. However, according to the method of the fifth embodiment, a plurality of substrates can be processed by laser irradiation at one time, and hence productivity can be improved.

Further, in the photovoltaic element in accordance with the fifth embodiment, there is not a portion A where films are not formed on the substrate, unlike the prior art example shown in FIG. 8, and films are formed entirely over the substrate. Therefore, the photovoltaic element has superior conversion efficiency and high light confining property.

Figure 7:
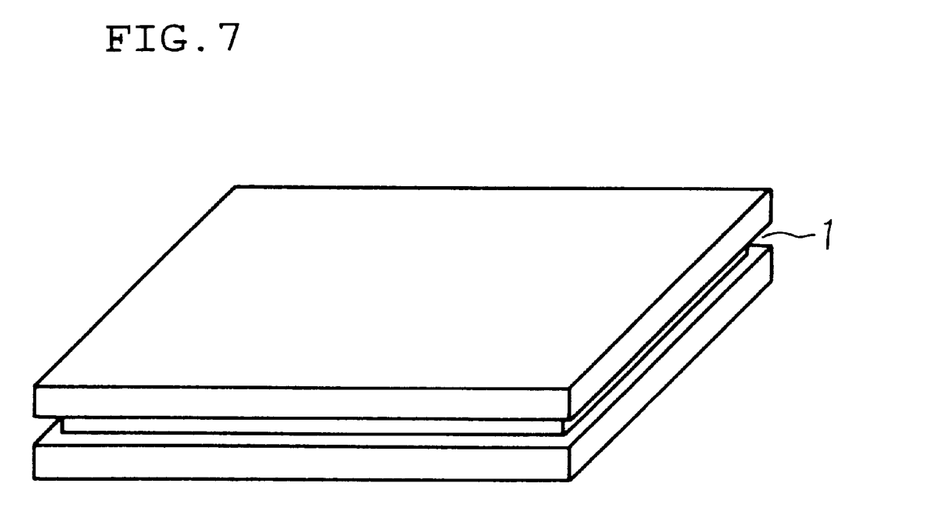
FIG. 7 is a perspective view showing a modification of the fifth embodiment.

FIG. 7 is a perspective view showing a modification of the fifth embodiment.

Referring to FIG. 7, in the photovoltaic element, the side surfaces of n type single crystal silicon substrate 7 are at least partially exposed in the thickness direction by a trench 1 formed continuously, surrounding the side surfaces.

In this manner, according to the present invention, it is not necessary to expose the side surfaces of the substrate entirely as in the fifth embodiment shown in FIG. 6. By exposing at least a portion of the side surfaces of the substrate in the thickness direction continuously, surrounding the side surfaces, the short-circuit of the photovoltaic elements caused by excessive extension of the films can be effectively prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic element comprising:
   a crystal semiconductor substrate of one conductivity type;
   a laminated body of an amorphous semiconductor layer of another conductivity type on one main surface of said substrate;
   a conductive thin film; and
   an intrinsic amorphous semiconductor layer provided between said substrate and said amorphous semiconductor layer,
   wherein a trench is formed at a peripheral portion of said laminated body on the one main surface of said substrate by removing at least the laminated body.

2. A photovoltaic element comprising:

a crystal semiconductor substrate of one conductivity type;

an amorphous semiconductor layer of another conductivity type and on one main surface of said substrate;

a conductive thin film;

an intrinsic amorphous semiconductor layer provided between said substrate and said amorphous semiconductor layer; and a back electrode is provided on the other main surface of said substrate, wherein a trench is formed at a peripheral portion of said back electrode on said the other main surface by removing said back electrode.

3. A photovoltaic element comprising:

a crystal semiconductor substrate of one conductivity type;

a laminated body of an amorphous semiconductor layer of the same conductivity type on said substrate;

a back electrode arranged on said laminated body; and an intrinsic amorphous semiconductor layer is provided between said substrate and said amorphous semiconductor layer, wherein a trench is formed at a peripheral portion of said laminated body on the one main surface of said substrate by removing at least the laminated body.

4. The photovoltaic element according to claim 3, wherein a conductive thin film is provided between said amorphous semiconductor layer and the back electrode.

5. The photovoltaic element according to claim 3, wherein a conductive thin film is provided between said amorphous semiconductor layer and the back electrode.

6. A photovoltaic element comprising:

a crystal semiconductor substrate of one conductivity type;

an amorphous semiconductor layer covering entirely over one main surface of said substrate and forming a heterojunction with said substrate;

a conductive thin film on said amorphous semiconductor layer; and an intrinsic amorphous semiconductor layer provided between said substrate and said amorphous semiconductor layer, wherein side surfaces of said crystal semiconductor substrate are at least partially exposed in thickness direction, and the exposed portion is continuous around outer peripheral side surfaces of said substrate.

7. A method of manufacturing a photovoltaic element obtained by forming at least an intrinsic amorphous semiconductor layer and an amorphous semiconductor layer to form a heterojunction, entirely over one main surface of a crystal semiconductor substrate of one conductivity type, said method comprising the step of:

irradiating side surfaces of said photovoltaic element with laser to remove an amorphous semiconductor layer formed on the side surfaces and exposing at least partially the side surfaces of said photovoltaic element in its thickness direction to surround the side surfaces.

8. The method of manufacturing a photovoltaic element according to claim 7, wherein side surfaces of a plurality of stacked said photovoltaic elements are irradiated with laser.

* * * * *